(12) United States Patent
Fujiwara et al.

(10) Patent No.: US 9,152,493 B2
(45) Date of Patent: *Oct. 6, 2015

(54) ERROR CHECK AND CORRECTION CIRCUIT AND SEMICONDUCTOR MEMORY

(71) Applicant: Samsung Electronics Co., Ltd., Suwon-Si, Gyeonggi-Do (KR)

(72) Inventors: Daisuke Fujiwara, Yokohama (JP); Makoto Hirano, Yokohama (JP)

(73) Assignee: Samsung Electronics Co., Ltd., Gyeonggi-do (KR)

(*) Notice: Subject to any disclaimer, the term of this patent is extended or adjusted under 35 U.S.C. 154(b) by 141 days.

This patent is subject to a terminal disclaimer.

(21) Appl. No.: 14/024,890

(22) Filed: Sep. 12, 2013

(65) Prior Publication Data

US 2014/0075266 A1    Mar. 13, 2014

(30) Foreign Application Priority Data

Sep. 12, 2012  (JP) .................................. 2012-200620
Apr. 11, 2013  (KR) ......................... 10-2013-0039899

(51) Int. Cl.
*G06F 11/10* (2006.01)
*H03M 13/15* (2006.01)
*H03M 13/00* (2006.01)

(52) U.S. Cl.
CPC ............ *G06F 11/10* (2013.01); *G06F 11/1048* (2013.01); *H03M 13/1545* (2013.01); *H03M 13/6561* (2013.01)

(58) Field of Classification Search
CPC ... G06F 11/10; G06F 11/1048; G06F 17/156; H03M 13/6561; H03M 13/1545; H03M 13/1525; H03M 13/15
See application file for complete search history.

(56) References Cited

U.S. PATENT DOCUMENTS

| | | | | |
|---|---|---|---|---|
| 5,414,719 A | * | 5/1995 | Iwaki et al. .................... | 714/785 |
| 2001/0052103 A1 | | 12/2001 | Hirofuji | |
| 2011/0047441 A1 | * | 2/2011 | Yamaga ......................... | 714/773 |
| 2012/0290896 A1 | * | 11/2012 | Kong et al. .................... | 714/763 |
| 2013/0080863 A1 | * | 3/2013 | Hida et al. ..................... | 714/784 |

FOREIGN PATENT DOCUMENTS

| | | |
|---|---|---|
| JP | 2001044853 A | 2/2001 |
| JP | 2001203587 A | 7/2001 |

* cited by examiner

*Primary Examiner* — April Y Blair
*Assistant Examiner* — Sazzad Hossain
(74) *Attorney, Agent, or Firm* — Harness, Dickey & Pierce, P.L.C.

(57) ABSTRACT

An error check and correction circuit includes a Chien search unit. The Chien search unit includes a calculation circuit and a plurality of Chien search circuits. The calculation circuit is configured to calculate a first bit stream by multiplying a value of (n–k) bits by a plurality of elements and a second bit stream by multiplying a value of k bits by the plurality of elements. The plurality of Chien search circuits configured to calculate the element by connecting the first bit stream and the second bit stream, and substitute the calculated element into the error correction search equation.

10 Claims, 9 Drawing Sheets

Fig. 2B

Error Location Search Equation $\Lambda(x) = e_4 X^4 + e_3 X^3 + e_2 X^2 + e_1 + e_0$

Fig. 4

(a)
S0= $\alpha^0$ =1
S1= $\alpha^1$ = $\alpha$
S2= $\alpha^2$
S3= $\alpha^3$
S4= $\alpha^4$
S5= $\alpha^5$
S6= $\alpha^6$
S7= $\alpha^7$
S8= $\alpha^8$ (b)
dp0=0
dp1=p1[4] · S4+p1[5] · S5+p1[6] · S6+p1[7] · S7+p1[8] · S8
dp2=p2[4] · S4+p2[5] · S5+p2[6] · S6+p2[7] · S7+p2[8] · S8
 ·
 ·
 ·

| Becky's Expression | Polynomial Expression | Vector Expression |
|---|---|---|
| 0 | 0 | 0 0 0 0 0 0 0 0 0 |
| 1 | 1 | 0 0 0 0 0 0 0 0 1 |
| $\alpha$ | $\alpha$ | 0 0 0 0 0 0 0 1 0 |
| $\alpha^2$ | $\alpha^2$ | 0 0 0 0 0 0 1 0 0 |
| $\alpha^3$ | $\alpha^3$ | 0 0 0 0 0 1 0 0 0 |
| $\alpha^4$ | $\alpha^4$ | 0 0 0 0 1 0 0 0 0 |
| $\alpha^5$ | $\alpha^5$ | 0 0 0 1 0 0 0 0 0 |
| $\alpha^6$ | $\alpha^6$ | 0 0 1 0 0 0 0 0 0 |
| $\alpha^7$ | $\alpha^7$ | 0 1 0 0 0 0 0 0 0 |
| $\alpha^8$ | $\alpha^8$ | 1 0 0 0 0 0 0 0 0 |
| $\alpha^9$ | $\alpha^4$ 1 | 0 0 0 0 1 0 0 0 1 |
| $\alpha^{10}$ | $\alpha^5$ $\alpha$ | 0 0 0 1 0 0 0 1 0 |
| $\alpha^{11}$ | $\alpha^6$ $\alpha^2$ | 0 0 1 0 0 0 1 0 0 |
| $\alpha^{12}$ | $\alpha^7$ $\alpha^3$ | 0 1 0 0 0 1 0 0 0 |
| $\alpha^{13}$ | $\alpha^8$ $\alpha^4$ | 1 0 0 0 1 0 0 0 0 |
| $\alpha^{14}$ | $\alpha^5$ $\alpha^4$ 1 | 0 0 0 1 1 0 0 0 1 |
| $\alpha^{15}$ | $\alpha^6$ $\alpha^5$ $\alpha$ | 0 0 1 1 0 0 0 1 0 |
| $\alpha^{16}$ | $\alpha^7$ $\alpha^6$ $\alpha^2$ | 0 1 1 0 0 0 1 0 0 |
| ⋮ | ⋮ | ⋮ |

Fig. 8A

|     | Bit | | | | |
| --- | --- | --- | --- | --- | --- |
|     | 8 | 7 | 6 | 5 | 4 |
| p0  | 0 | 0 | 0 | 0 | 0 |
| p1  | 0 | 0 | 0 | 0 | 1 |
| p2  | 0 | 0 | 0 | 1 | 0 |
| p3  | 0 | 0 | 0 | 1 | 1 |
| p4  | 0 | 0 | 1 | 0 | 0 |
| p5  | 0 | 0 | 1 | 0 | 1 |
| p6  | 0 | 0 | 1 | 1 | 0 |
| p7  | 0 | 0 | 1 | 1 | 1 |
| p8  | 0 | 1 | 0 | 0 | 0 |
| p9  | 0 | 1 | 0 | 0 | 1 |
| p10 | 0 | 1 | 0 | 1 | 0 |
| p11 | 0 | 1 | 0 | 1 | 1 |
| p12 | 0 | 1 | 1 | 0 | 0 |
| p13 | 0 | 1 | 1 | 0 | 1 |
| p14 | 0 | 1 | 1 | 1 | 0 |
| p15 | 0 | 1 | 1 | 1 | 1 |
| ... | ... | ... | ... | ... | ... |
| p30 | 1 | 1 | 1 | 1 | 0 |
| p31 | 1 | 1 | 1 | 1 | 1 |

Fig. 8B

|     | Bit | | | |
| --- | --- | --- | --- | --- |
|     | 3 | 2 | 1 | 0 |
| q0  | 0 | 0 | 0 | 0 |
| q1  | 0 | 0 | 0 | 1 |
| q2  | 0 | 0 | 1 | 0 |
| q3  | 0 | 0 | 1 | 1 |
| q4  | 0 | 1 | 0 | 0 |
| q5  | 0 | 1 | 0 | 1 |
| q6  | 0 | 1 | 1 | 0 |
| q7  | 0 | 1 | 1 | 1 |
| q8  | 1 | 0 | 0 | 0 |
| q9  | 1 | 0 | 0 | 1 |
| q10 | 1 | 0 | 1 | 0 |
| q11 | 1 | 0 | 1 | 1 |
| q12 | 1 | 1 | 0 | 0 |
| q13 | 1 | 1 | 0 | 1 |
| q14 | 1 | 1 | 1 | 0 |
| q15 | 1 | 1 | 1 | 1 |

ERROR CHECK AND CORRECTION CIRCUIT AND SEMICONDUCTOR MEMORY

CROSS-REFERENCE TO RELATED APPLICATIONS

This US non-provisional patent application claims priority under 35 USC §119 to Japanese Patent Application No. 2012-200620, filed on Sep. 12, 2012 and Korean Patent Application No. 10-2013-0039899, filed on Apr. 11, 2013, the entireties of which are hereby incorporated by reference.

BACKGROUND OF THE INVENTION

Example embodiments of the inventive concepts relate to error check and correction circuits and semiconductor memories.

In a high-capacity memory such as a NAND flash memory, there is a possibility of stored data loss caused by various factors during data retention. An error rate tends to increase with large-scale memory capacity and miniaturization of manufacturing process. In order to overcome such a problem, an error check and correction (ECC) circuit has been used to improve performance of a flash memory. A highly reliable memory may be provided by mounting an ECC system as on-chip. Since data cannot be output to an external entity until a correction process is terminated in the ECC system, a technique is required to reduce this time.

In order to overcome the above problem, studies have been conducted on the use of high-speed Hamming codes and speedup of Bose-Chaudhuri-Hocquenghem (BCH) code that is capable of performing high-level correction. The BCH code is a type of block code using a finite or Galois field that contains a finite number of elements. In a block code such as BCH code or Reed-Solomon (RS) code, error location may be calculated using an error location search equation. For example, error location search is performed by sequentially substituting respective elements (other than zero) of the Galois field into the error location search equation and searching elements of the equation. The search of the elements is called a Chien search. Techniques associated with the Chien search are disclosed in Japanese Patent Application Nos. 2001-044853 (hereinafter referred to as "Patent Document 1") and 2001-203587 (hereinafter referred to as "Patent Document 2").

Patent Documents 1 and 2 describe Chien search circuits that implement error correction search equations using a flip-flop or register, a multiplication circuit or the like. A signal indicating a location of bit is input to the Chien search circuit to determine whether there is an error in the bit. Therefore, to determine whether there is an error in multiple bits in parallel requires a corresponding increase in the number of Chien search circuits. As the number of the Chien search circuits increases, the number of wirings for providing signals indicating locations of bits at the Chien search circuits also increases. Accordingly, if the number of the bits processed in parallel increases, the size of a Chien search unit including the Chien search circuits and their peripheral circuits also increases.

RELATED ART DOCUMENT

Patent Document

Patent Document 1: Japanese Patent Application Publication No. 2001-044853

Patent Document 2: Japanese Patent Application Publication No. 2001-203587

SUMMARY OF THE INVENTION

Example embodiments of the inventive concepts provide an error check and correction circuit and a semiconductor memory.

According to one example embodiment of the inventive concepts, an error check and correction circuit may be provided with a Chien search unit determining whether there is an error in each data stream using a certain element of Galois field $GF(2^n)$ as a substituted value of an error location search equation. The Chien search unit may include a calculation circuit configured to calculate a first bit stream by multiplying a predetermined value of (n−k) bit by a plurality of elements and a second bit stream by multiplying a predetermined value of k bit by the plurality of elements and a plurality of Chien search circuits configured to calculate the certain element by connecting the first bit stream and the second input stream input from the calculation circuit and substitute the calculated element into the error correction search equation. The plurality of Chien search circuits may be arranged in a matrix in row and column directions. The first bit stream may be provided in one of the row and column direction, and the second bit stream may be provided in the other direction.

In example embodiments of the inventive concepts, the Chien search circuit may be provided in plurality equal to or larger than the number of bits of the data stream.

According to one example embodiment of the inventive concepts, a semiconductor memory may include an error check and search circuit, a memory cell, and a data storage configured to temporarily maintain a data stream read from the memory cell and provide the temporarily maintained data stream to the error check and correction circuit. The error check and correction circuit includes a Chien search unit determining whether there is an error in each data stream using a certain element of Galois field $GF(2^n)$ as a substituted value of an error location search equation. The Chien search unit may include a calculation circuit configured to calculate a first bit stream by multiplying a predetermined value of (n−k) bit by a plurality of elements and a second bit stream by multiplying a predetermined value of k bit by the plurality of elements and a plurality of Chien search circuits configured to calculate the certain element by connecting the first bit stream and the second input stream input from the calculation circuit and substitute the calculated element into the error correction search equation. The plurality of Chien search circuits may be arranged in a matrix in row and column directions. The first bit stream may be provided in one of the row and column direction, and the second bit stream may be provided in the other direction.

At least one example embodiment relates to an error correction circuit.

In one embodiment, the error correction circuit includes a plurality of Chien search circuits arranged in a matrix and configured to generate an error location indicating signal indicating locations of errors in a group of bits of a bit stream simultaneously using an error correction search equation having indeterminates selected from elements of a finite field.

In one embodiment, the error correction circuit further includes an S calculator configured to, separate bits in each of the elements of the finite field into a first group of bits and a second group of bits; and provide the first group of bits to row lines of the matrix of Chien circuits and the second group of bits to column lines of the matrix of Chien circuits.

In one embodiment, the first group of bits is a first one of the least significant bits (LSB) and most significant bits (MSB) of the elements and the second group of bits is a second one of the LSB and MSB of the elements.

In one embodiment, the error correction circuit further includes a syndrome calculation circuit configured to generate the error correction search equation such that the error correction search equation is a minimum polynomial representing the group of bits; and a coefficient calculator configured to calculate coefficients associated with each of the indeterminates of the error correction search equation.

In one embodiment, the Chien circuits are configured to locate errors in the bit stream in the group of bits by, substituting the elements from the finite field into the indeterminates of the error correction search algorithm, the elements provided in batch to the matrix of Chien circuits via the first group of bits and the second group of bits, calculating a value of the error correction search algorithm based on the substituted elements and the calculated coefficients, and determining if the group of bits contains errors based on a result of the calculation.

In one embodiment, the plurality of Chien search are configured to determine a bit within the group of bits contains errors when the calculated value of the error correction search algorithm does not equal zero.

In one embodiment, the error correction circuit is configured to correct the error by inverting a bit value at locations within the group of bits determined to contain the errors.

BRIEF DESCRIPTION OF THE DRAWINGS

Example embodiments of the inventive concepts will become more apparent in view of the attached drawings and accompanying detailed description. The example embodiments depicted therein are provided by way of example, not by way of limitation, wherein like reference numerals refer to the same or similar elements. The drawings are not necessarily to scale, emphasis instead being placed upon illustrating aspects of inventive concepts.

FIGS. 2A and 2B are block diagrams of an error check and correction circuit included in the nonvolatile memory device of FIG. 1 according to an example embodiment.

FIG. 4 illustrates an output signal of an S calculator, an output signal of a P calculator, and an output signal of a Q calculator included in the Chien search unit of FIG. 3.

FIG. 7 is a table illustrating the processing content of the Chien search unit in FIG. 3.

FIGS. 8A and 8B are tables illustrating the processing content of the Chien search unit in FIG. 3.

DETAILED DESCRIPTION

Figure 1:
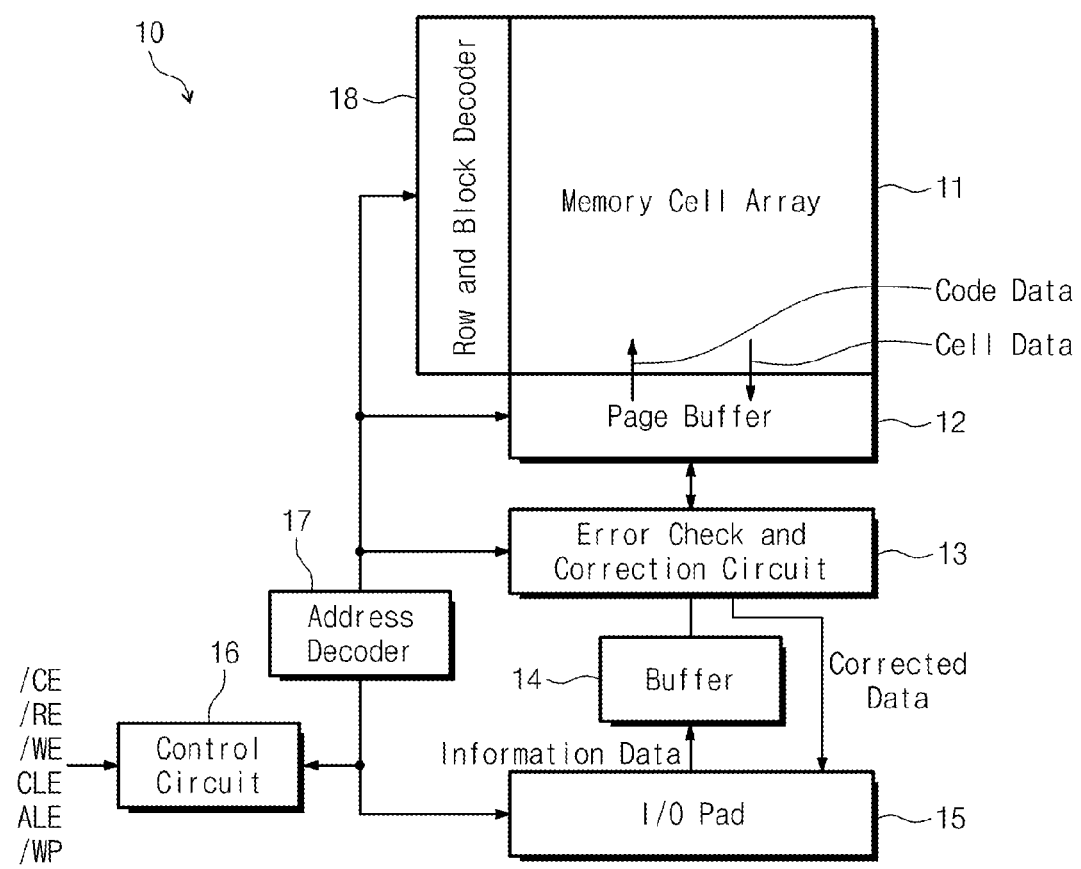
FIG. 1 is a block diagram of a nonvolatile memory device (semiconductor memory) according to an example embodiment of the inventive concepts.

Example embodiments of the inventive concepts will now be described more fully with reference to the accompanying drawings, in which example embodiments of the inventive concepts are shown. Example embodiments of the inventive concepts may, however, be embodied in many different forms and should not be construed as limited to the embodiments set forth herein. Rather, these example embodiments of the inventive concepts are provided so that this description will be thorough and complete, and will fully convey the concepts of example embodiments of the inventive concepts to those of ordinary skill in the art. In the drawings, the thicknesses of layers and regions are exaggerated for clarity.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In the following description, illustrative embodiments will be described with reference to acts and symbolic representations of operations (e.g., in the form of flowcharts) that may be implemented as program modules or functional processes include routines, programs, objects, components, data structures, etc., that perform particular tasks or implement particular data types and may be implemented using hardware. Such hardware may include one or more Central Processing Units (CPUs), digital signal processors (DSPs), application-specific-integrated-circuits, field programmable gate arrays (FPGAs) computers or the like.

FIG. 1 is a block diagram of a NAND flash memory that is a nonvolatile semiconductor memory device 10 according to an example embodiment of the inventive concepts.

As illustrated in FIG. 1, the nonvolatile semiconductor memory device 10 includes a memory cell array 11, a page buffer 12, an error check and correction circuit 13, a buffer 14, an I/O pad 15, a control circuit 16, an address decoder 17, and a row and block decoder 18.

The memory cell array 11 includes a plurality of stacked gate type transistors, i.e., a plurality of blocks in which electrically rewritable memory cells (memory elements) are serially connected in a column direction and a plurality of NAND cell strings formed on respective bitlines are arranged in a row direction (arrangement direction of bitlines). The blocks are arranged in a wiring direction of the bitline. The blocks are set in erase units of data of a memory cell. In each of the blocks, a wordline orthogonal to a bitline is connected to a gate of each of the nonvolatile memory cells arranged at the same row. The range of a nonvolatile memory cell selected by a single wordline is a page that is a program and read unit.

The page buffer 12 includes a page buffer circuit provided at each bitline to program and read page-level data. Each page buffer circuit of the page buffer 12 is connected to each bitline and includes a latch circuit used as a sense amplifier circuit to amplify and determine a potential of the connected bitline.

During a data read operation of the nonvolatile semiconductor memory device 10, the page buffer (data storage) 12 receives cell data that is data (data stream) memorized by memory cells in a single page of the memory cell array 11 and outputs the received data to the error check and correction circuit 13 after amplifying the received data. During a data write (program) operation of the nonvolatile semiconductor memory device 10, the page buffer 12 stores data provided from the error check and correction circuit 13 in an internal latch circuit and writes all data into memory cells of a single page as code data while performing a verify operation. The code data includes parity data generated by the error check and correction circuit 13.

For example, the error check and correction circuit 13 may regard data streams having a length of 256 bits as a correction unit using Galois field $GF(2^9)$ and may use a 4-bit error-correctable Bose-Chaudhuri-Hocquenghem BCH code. Therefore, the length of parity data in each correction unit may be 36 bits. Therefore, an encoded data stream has a data length of 292-bits (256 bits+36 bits) plus a bit length of additional other-bits (e.g. 28 bits). Therefore, the data length of an encoded data stream may be 320 bits (292 bits+28 bits). Example embodiments of the inventive concepts are not limited to BCH codes and may be applied to block codes (BCH code, RS code, etc.) using Galois field operation.

During a data read operation of the nonvolatile semiconductor memory device 10, the error check and correction circuit 13 processes data read from the page buffer 12 in units of sectors, calculates a coefficient of an error location search polynomial, and maintains a calculation result after latching the calculation result to the inside of the error check and correction circuit 13. During a read operation, the error check and correction circuit 13 corrects an error of data of bits whose location is specified by a column address and outputs the corrected data to an external entity through the I/O pad 15.

During a data write operation of the nonvolatile semiconductor memory device 10, the error check and correction circuit 13 receives information data from the I/O pad 15. The error check and correction circuit 13 generates parity data from the received information data and outputs the received information data and the parity data to the page buffer 12. The page buffer 12 writes received data into memory cells connected to a selected page as code data.

The control circuit 16 inputs various types of control signals to control program, read, erase, and verify operation of data on nonvolatile memory cells. For example, the control signals may include an external clock signal, a chip enable signal /CE, a read enable signal /RE, a program enable signal WE, a command latch enable signal CLE, an address latch enable signal ALE, a write inhibit signal /WE, and the like.

The control circuit 16 outputs an internal control signal to each circuit in response to a control signal and an operation mode that command data input from the I/O pad 15 indicates. For example, the control circuit 16 reads command data from the I/O pad 15 and stores the command data in an internal register in response to the fact that the command latch enable signal CLE transitions from a low level L to a high level H at a first start of the program enable signal /WE.

The address decoder 17 maintains addresses (a row address, a block address, and a column address) input from the I/O pad 15, based on an internal control signal from the control circuit 16. The address decoder 17 outputs the maintained address to the row and block decoder 18, the page buffer 12, and the error check and correction circuit 13, based on an internal control signal from the control circuit 16.

For example, the control circuit 16 maintains an address from the I/O pad 15 in an internal register of the address decoder 17 in response to the fact that an address latch enable signal ALE transitions from a low level (L) to a high level (H) during the first start of the program enable signal /WE.

The row and block decoder 18 selects a block and a wordline of the memory cell array 11 in response to the row address and the block address maintained and output by the address decoder 17 to select memory cells in a single page. The address decoder 17 selects a bitline of the memory cell array 11 and the page buffer 12 in response to a column address that is maintained therein.

In example embodiments of the inventive concepts, during a data read operation, cell data in the page buffer 12 is transmitted to the error check and correction circuit 13 and a coefficient of an error location search equation is calculated in each error correction unit. In response to the coefficient calculated in each error correction unit and an error location indicating signal (i.e., data indicating each element of the Galois field $GF(2^9)$), it is determined whether there is an error in data of a bit whose location is specified by the error location indicating signal. If there is an error, the bit is corrected to be output to the I/O pad 15 as corrected data. This will be explained in detail later.

During a data write operation, the cell data stored in the page buffer 12 is transmitted to the buffer 14. The buffer 14 may be, for example, a static random access memory (SRAM).

In the buffer 14, data of a portion corresponding to an input column address among the cell data may be updated to information data from the I/O pad 15. In the error check and correction circuit 13 parity data is calculated that corresponds to data equivalent to a single correction unit including updated data of the buffer 14. Encoded data including the parity data is written into a selected page through the page buffer 12 as code data.

Figure 2A:
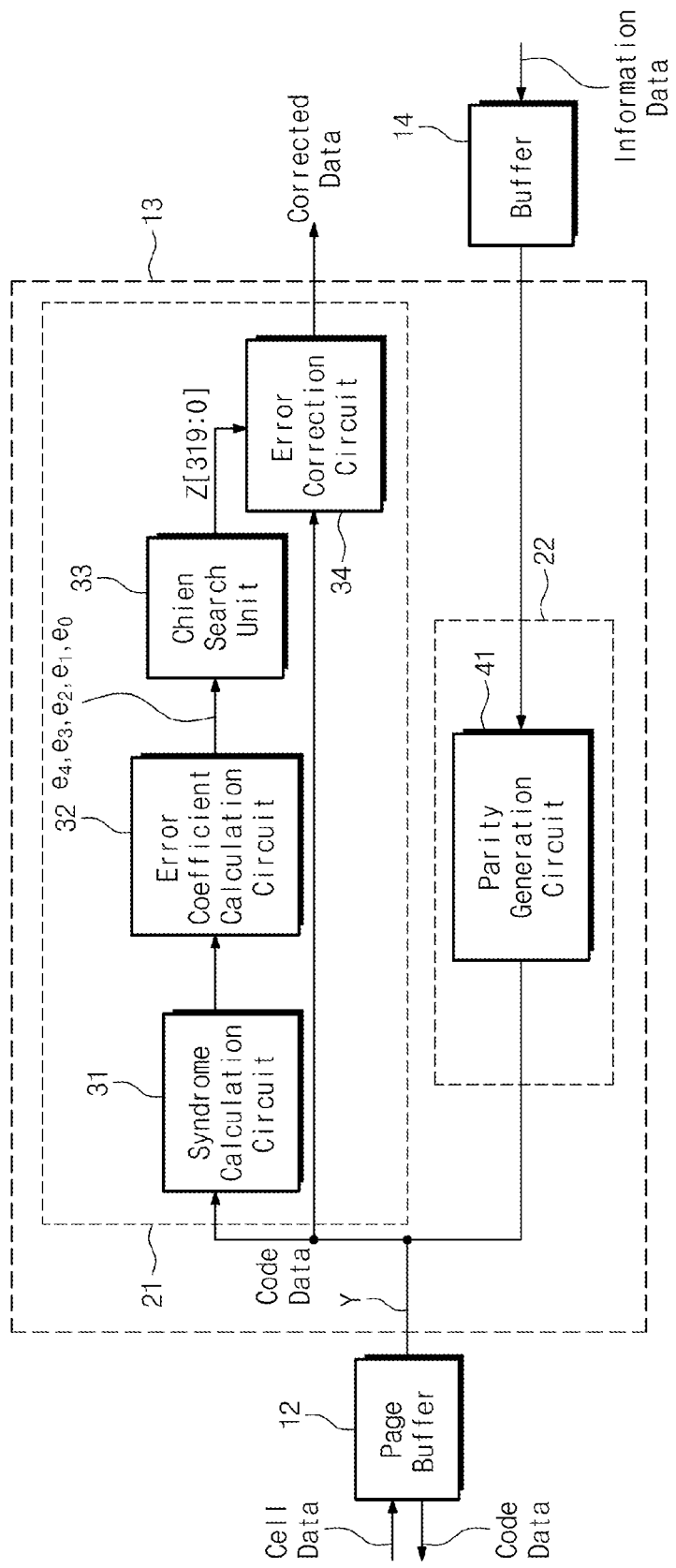

FIG. 2A is a block diagram of an error check and correction circuit included in the nonvolatile memory device of FIG. 1 according to an example embodiment.

As illustrated in FIG. 2A, the error check and correction circuit 13 includes a decoder unit 21 decoding data and an encoder unit 22 generating parity data for correction and adding the parity data for correction to data written into a cell.

The encoder unit 22 includes a parity generation circuit 41. The parity generation circuit 41 generates parity data obtained by dividing information data written into the buffer 14 by a generated polynomial. The parity generation circuit 41 outputs the generated parity data to the page buffer 12 after adding the parity data to the information data. The output data is code data written into a selected single page when data of the nonvolatile semiconductor memory device 10 is written. In example embodiments of the inventive concepts the data correction process is performed using the configuration efficient to reduce a layout size of the error check and correction circuit 13 when data from the nonvolatile semiconductor memory device 10 is read.

The decoder unit 21 includes a syndrome calculation circuit 31, an error coefficient calculation circuit 32, a Chien search unit 33, and an error correction circuit 34. The syndrome calculation circuit 31 calculates a plurality of syndromes by receiving code data stream (Code Data Y) in each unit of correction and dividing the received Code Data Y in an independent minimal polynomial. In example embodiments of the inventive concepts, a BCH code capable of correcting an error of 4 bits of data is used. Accordingly, there are four independent minimal polynomials. Thus, the syndrome calculation circuit 31 calculates four syndromes S1, S3, S5, and S7.

The error coefficient calculation circuit 32 calculates coefficients e4, e3, e2, e1, and e0 of error location search equation $\Lambda(x)$ in each unit of correction. The coefficients e4, e3, e2, e1, and e0 are coefficients of error location search equation "$\Lambda(x)=e4x^4+e3x^3+e2x^2+e1x^1+e0$" shown in FIG. 2B. The error location search equation $\Lambda(x)$ is used by the Chien search unit 33 when searching whether there is an error in a bit read from the page buffer in each unit of correction.

The Chien search unit 33 checks an error of the coefficients e4, e3, e2, e1, and e0 input from the error coefficient calculation circuit 32 in each unit of correction. If an error is checked, the Chien search unit 33 outputs a signal Z[319:0] indicating a corresponding bit location. The signal Z[319:0] is 320 bits of data indicating a value of an error location search equation corresponding to each bit location. Signals Z[0], Z[1], . . . , and Z[319] indicate whether there is an error in data of zero, first, . . . , and $319^{th}$ bit locations, respectively. In example embodiments of the inventive concepts, let it be assumed that an $i^{th}$ bit where a value of a signal Z[i] is '1' is an error bit and an $i^{th}$ bit where the value thereof is '0' is an error-free bit.

The error correction circuit 34 inverts a value of a bit of error-detected location among the code data stream (Code Data Y) when an error bit expressed as a signal Z[319:0] is 4 bits or less, i.e., the number of i where "Z[i]=1" is four or less.

Figure 3:
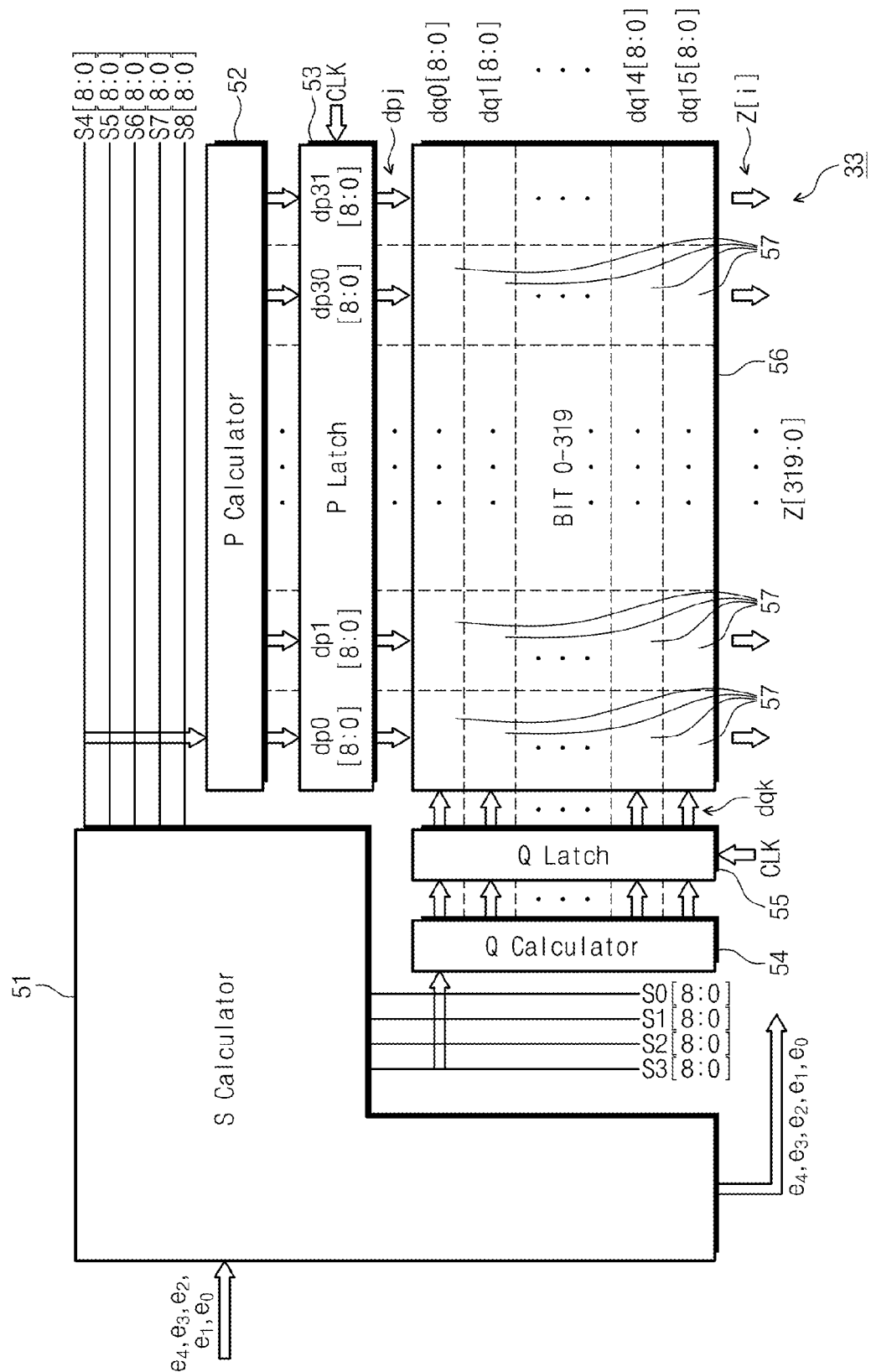
FIG. 3 is a block diagram of a Chien search unit included in the error check and correction circuit of FIG. 2A according to an example embodiment.

FIG. 3 is a block diagram of a Chien search unit included in the error check and correction circuit of FIG. 2A according to an example embodiment.

As shown in FIG. 3, the Chien search unit 33 includes an S calculator 51, a P calculator 52, a P latch 53, a Q calculator 54, a Q latch 55, and a Chien search circuit group 56.

The Chien search circuit group 56 includes a plurality of Chien search circuits 57 arranged in a matrix in row and column directions. For example, the Chien search circuits 57 are arranged in a matrix of 16 rows and 32 columns (e.g., in a lattice of 16 circuits in a vertical direction and 32 circuits in a horizontal direction). However, the Chien search circuits 57 need not be provided at all intersections of rows and columns (e.g., 512 (=16×32) intersections) and some of the Chien search circuits 57 may be omitted according to data length of encoded data stream (i.e., the number of bits that are being used).

FIG. 4 illustrates an output signal of the S calculator 51, an output signal of the P calculator 52, and an output signal of a Q calculator 54 included in the Chien search unit 33 of FIG. 3. Each of the Chien search circuits 57 included in the Chien search circuit group 56 may be configured as shown in FIG. 5.

Figure 5:
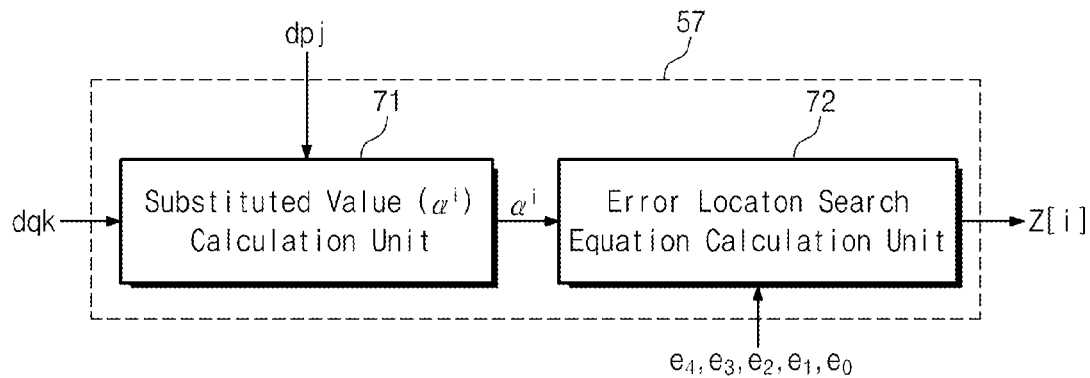
FIG. 5 is a block diagram of a Chien search circuit included in the Chien search unit of FIG. 3 according to an example embodiment.

FIG. 5 is a block diagram illustrating a configuration example of the Chien search circuit 57 in FIG. 3 according to an example embodiment.

As illustrated in FIG. 5, the Chien search circuit includes a substituted value calculation unit 71 and an error location search equation calculation unit 72.

The substituted value calculation unit 71 calculates one of Galois field elements $\alpha^i$ (i=0, 1, 2, . . . , 514=$2^9$−1)) substituted into 'x' of the error location search equation $\Lambda(x)$ by receiving a bit stream signal dpj (j being one of 0~31) provided from the P latch 53 and a bit stream signal dqk (k being one of 0~15) provided from the Q latch 55 and adding the received signals (i.e., dpj+dqk).

The error location search equation calculation unit 72 substitutes an element $\alpha^i$ into the error location search equation $\Lambda(x)$ and calculates a value of the error location search equation $\Lambda(x)$, based on the element $\alpha^i$ provided from the substituted value calculation unit 71 and the coefficients e4, e3, e2, e1, and e0 of the error location search equation provided from the S calculator 51. That is, the error location search equation calculation unit 72 calculates the error location search equation $\Lambda(x)$ as "x=$\alpha^i$". A value of $i^{th}$ bit of a signal Z[319:0] is set to '1' when "$\Lambda(\alpha^i)$=0" and set to '0' when "$\Lambda(\alpha^i)\neq 0$".

Figure 6:
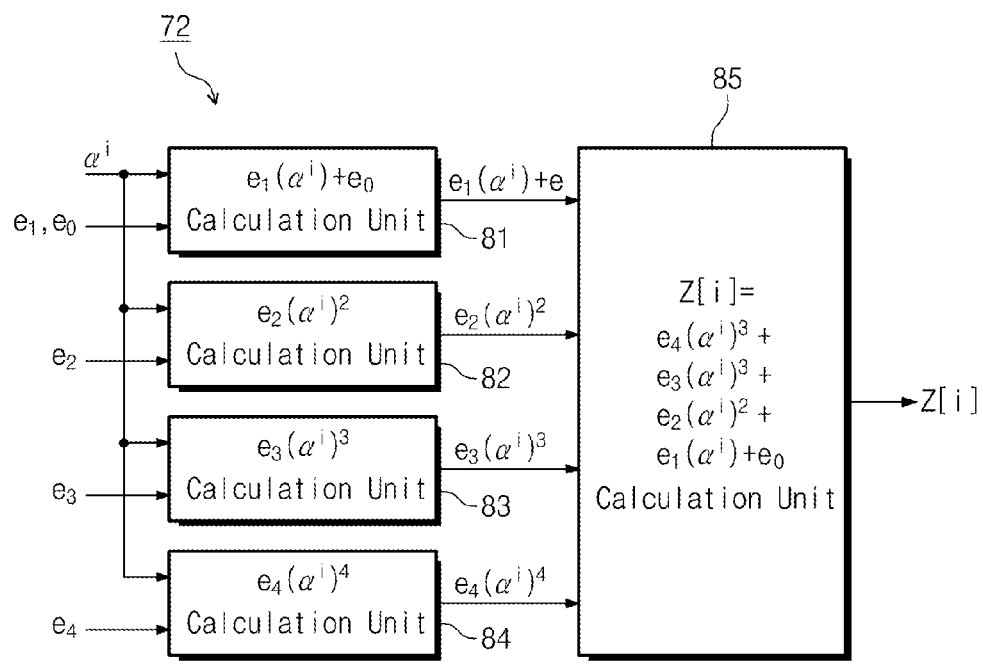
FIG. 6 is a block diagram of an error location search equation calculating unit included in the Chien search circuit of FIG. 5 according to an example embodiment.

FIG. 6 is a block diagram illustrating a configuration example of the error location search equation calculation unit 72 in FIG. 5 according to an example embodiment.

As illustrated in FIG. 6, the error location search equation calculation unit 72 includes an "$e1(\alpha^i)+e0$" calculation unit 81, an "$e2(\alpha^i)^2$" calculation unit 82, an "$e3(\alpha^i)^3$" calculation unit 83, an "$e4(\alpha^i)^4$" calculation unit 84, and a "Z[i]" calculation unit 85. The "$e1(\alpha^i)+e0$" calculation unit 81 calculates "$e1(\alpha^i)+e0$" using the element $\alpha^i$ and the coefficients e1 and e0. The "$e2(\alpha^i)^2$" calculation unit 82 calculates "$e2(\alpha^i)^2$" using the element $\alpha^i$ and the coefficient e2. The "$e3(\alpha^i)^3$" calculation unit 83 calculates "$e3(\alpha^i)^3$" using the element $\alpha^i$ and the coefficient e3. The "$e4(\alpha^i)^4$" calculation unit 84 calculates "$e4(\alpha^i)^4$" using the element $\alpha^i$ and the coefficient e4. The "Z[i]" calculation unit 85 calculates "$e4(\alpha^i)^4+e3(\alpha^i)^3+e2(\alpha^i)^2+e1(\alpha^i)+e0$" using outputs of the "$e1(\alpha^i)+e0$" calculation unit 81, the "$e2(\alpha^i)^2$" calculation unit 82, the "$e3(\alpha^i)^3$" calculation unit 83, and the "$e4(\alpha^i)^4$" calculation unit 84. The "Z[i]" calculation unit 85 determines whether a calculated value is zero and, based on a result of the determination, sets and outputs a value Z[i] of $i^{th}$ bit of a signal Z[319:0] to '1' when "$\Lambda(\alpha^i)$=0" and to '0' when "$\Lambda(\alpha^i)\neq 0$". The "$e2(\alpha^i)^2$" calculation unit 82, the "$e3(\alpha^i)^3$" calculation unit 83, and the "$e4(\alpha^i)^4$" calculation unit 84 may include, for example, a plurality of multipliers. In this case, each calculated value may be calculated during a single clock cycle.

The S calculator 51 receives the coefficients e4, e3, e2, e1, and e0 from the error coefficient calculation circuit 32 and outputs the received coefficients e4, e3, e2, e1, and e0 to the respective Chien search circuit 57. In addition, the S calculator 51 generates some of elements of Galois field GF($2^9$) used when each of the Chien search circuit 57 generates a value substituted into the error location search equation $\Lambda(x)$ during Chien search and outputs the generated elements as signals S1, S2, S3, S4, S5, S6, S7, and S8.

FIG. 7 is a table showing some of the elements of Galois field $GF(2^9)$.

As shown in FIG. 7, the elements of the Galois field $GF(2^9)$ may be expressed by Becky's expression, polynomial expression, and vector expression. In the Galois field $GF(2^9)$(m=9), nine elements "$1(=\alpha^0)$, $\alpha^1$, $\alpha^2$, $\alpha^{(m-1)}(=\alpha 8)$" in the Becky's expression have a value where only one of respective bits of 9 bits in the vector expression is '1'. Nine elements "$\alpha^0$, $\alpha^1$, $\alpha^2$, ..., and $\alpha^8$" in the Becky's expression are expressed as '000000001', '000000010', '000000100', '000001000', '000010000', '000100000', '001000000', '010000000', and '100000000' in the vector expression, respectively. Thus, all elements $\alpha^i$ (i=0, 1, 2, ..., $2^{(m-1)}$(=511)) of the Galois field $GF(2^9)$ may be expressed as a plurality of combinations of the nine elements "$\alpha^0$, $\alpha^1$, $\alpha^2$, ..., and $\alpha^8$" (i.e., as a result added to each other).

For example, an element $\alpha^9$ corresponding to bit 9 may be generated according to Equation (1) when being substituted into the error location search equation $\Lambda(x)$.

$$\alpha^9 = 1 + \alpha 4 \qquad \text{Equation (1)}$$

Similarly, all values of "$\alpha^{10}$, ..., $\alpha^{511}$" may be calculated by combination of the foregoing nine elements "$\alpha^0$, $\alpha^1$, $\alpha^2$, ..., and $\alpha^8$".

The S calculator 51 generates values of nine elements $\alpha^0$, $\alpha^1, \alpha^2, \ldots, \alpha^8$ and outputs the values as signals S1, S2, S3, S4, S5, S6, S7, and S8, as shown in FIG. 4A. Each of the signals S1, S2, S3, S4, S5, S6, S7, and S8 is a 9-bit signal.

As set forth above, the Chien search circuit 57 calculates a substituted value by an addition process of the substituted value calculation unit 57 and substitutes the calculated value using the error location search equation calculation unit 72 to calculate a value of location search equation $\Lambda(x)$. Accordingly, each of the Chien search circuits 57 may calculate any one element $\alpha^i$ from all the elements $\alpha^0, \ldots, \alpha^{511}$ when receiving signals indicating the nine elements $\alpha^0$, $\alpha^1$, $\alpha^2, \ldots, \alpha^8$. Accordingly, each of the Chien search circuits 57 may calculate a value of the error location search equation $\Lambda(x)$ with respect to any elements $\alpha^0, \ldots, \alpha^{511}$. In this case, all the signals indicating the nine elements $\alpha^0, \alpha^1, \alpha^2, \ldots, \alpha^8$ must be provided to the respective Chien search circuit 57. However, all the Chien search circuits 57 do not use all the signals indicating the nine elements $\alpha^0$, $\alpha^1$, $\alpha^2$, ..., $\alpha^8$. Providing of unnecessary signals means installation of unnecessary wiring.

In the configuration explained with reference to FIG. 3, in order to reduce unnecessary wirings, the signals indicating the nine elements $\alpha^0$, $\alpha^1$, $\alpha^2$, ..., $\alpha^8$ are selected as basal values, the basal values are grouped into two signal parts (P part and Q part), each of the signal parts are divided into 32 or 16 (i.e., 512) using a quasi-basal value, and first division signals of the signal parts are provided to the respective Chien search circuits 57, respectively. Thus, only one element $\alpha^i$ may be calculated in the respective Chien search circuits 57.

In example embodiments of the inventive concepts, any one element $\alpha^i$ may be calculated only using two signal lines of 9 bits (total 18 bits) that are orthogonal to the Chien search circuit 57.

FIGS. 8A and 8B are tables illustrating the processing content of the Chien search unit in FIG. 3.

As illustrated in FIGS. 8A and 8B, the nine elements $\alpha^0$, $\alpha^1$, $\alpha^2$, ..., $\alpha^8$ are divided into a P part having 5 bits, as illustrated in FIG. 8A, and a Q part having 4 bits, as illustrated in FIG. 8B. More specifically, the P part has values '00000', '00001, '00010', ..., '11111' and includes values corresponding to quasi-basal values $\alpha^4, \alpha^5, \alpha^6, \alpha^7$, and $\alpha^8$ that are equivalent to the upper 5 bits of 'x', as shown in FIG. 8A. The Q part includes values corresponding to basal values $\alpha^0$, $\alpha^1$, $\alpha^2$, and $\alpha^3$ that are equivalent to the lower 4 bits of 'x'.

In example embodiments of the inventive concepts, in addition to the nine elements $\alpha^0$, $\alpha^1, \alpha^2, \ldots, \alpha^8$, the other elements $\alpha^9, \ldots, \alpha^{(t-1)}(t=2^m)$ are generated by combining bit stream signals dpj and dqk generated using quasi-basal values. The bit stream signals dpj and dqk are calculated by the P calculator 52 and the Q calculator 54, respectively.

Referring back to FIG. 4, the P calculator 52 generates and outputs bit stream signals dp0, dp1, dp2, ..., dp30, and dp31 each having 9 bits according to the calculation formula shown in FIG. 4, based on the 9 bit signals S4, S5, S6, S7, and S8.

As illustrated in FIG. 4, a signal dp1 may be calculated as the sum of bit '4' of the quasi-basal value p1 shown in FIG. 8A having a value of '1' multiplied by each bit of the signal S4, bit '5' having a value of '0' multiplied by each bit of the signal S5, bit 6 having a value of '0' multiplied by each bit of the signal S6, bit 7 having a value of '0' multiplied by each bit of the signal S7 and bit 8 having a value of '0' multiplied by each bit of the signal S8.

In addition, the signal dp2 may be calculated as the sum of bit '4' of the quasi-basal value p2 shown in FIG. 8A having a value of '0' multiplied by each bit of the signal S4, bit 5 having a value of '1' multiplied by each bit of the signal S5, bit 6 having a value of '0' multiplied by each bit of the signal S6, bit 7 having a value of '0' multiplied by each bit of the signal S7, and bit 8 having a value of '0' multiplied by each bit of the signal S8.

The signals dp0, dp1, dp2, ..., dp30, and dp31 calculated by the P calculator 52 are stored in the P latch 53. The P latch 53 outputs the signals dp0, dp1, dp2, ..., dp30, and dp31 latched in synchronization with a desired (or alternatively, a predetermined) clock signal to adjust a clock skew. The signals dp0, dp1, dp2, ..., dp30, and dp31 output from the P latch 53 are provided to the plurality of Chien search circuits 57 through 32 signal line parts, each of 9 bits, disposed in a column direction.

The Q calculator 54 outputs bit stream signals dq0, dq1, dq2, ..., dq14, and dq15 each of 9 bits according to the calculation formula shown in FIG. 4, based on the signals S0, S1, S2, and S3, each having 9 bits.

For example, the signal dq1 may be calculated as the sum of bit '3' of the quasi-basal value q1 shown in FIG. 8B having a value of '1' multiplied by each bit of the signal S3, bit '2' having a value of '0' multiplied by each bit of the signal S2, bit '1' having a value of '0' multiplied by each bit of the signal S1, and bit 0 having a value of '1' multiplied by each bit of the signal S0.

In addition, the signal dq2 may be calculated as the sum of bit '3' of the quasi-basal value q2 shown in FIG. 8B having a value of '0' multiplied by each bit of the signal S3, bit '2' having a value of '0' multiplied by each bit of the signal S2, bit '1' having a value of '1' multiplied by each bit of the signal S2, and bit '0' having a value of '0' multiplied by each bit of the signal S0.

The signals dq0, dq1, dq2, ..., dq14, and dq15 calculated by the Q calculator 54 are input to the Q latch 55. The Q latch 55 outputs the signal dq0, dq1, dq2, ..., dq14, and dq15 latched in synchronization with a desired (or alternatively, a predetermined) clock signal to adjust a clock skew. The signals dq0, dq1, dq2, ..., dq14, and dq15 output from the Q latch 55 are provided to the plurality of Chien search circuits 57 through 16 signal line part, each of 9 bits, disposed in a row direction.

The configuration of the bit stream signal dpj or dqk is not limited to the above (j=0~31, k=0~15). That is, a wiring direction of the bit stream signals dpj and dqk may be made inverse in row and column or wirings of the bit stream dpj or dqk may vary in number. That is, in an example embodiment of the inventive concepts, a plurality of Chien search circuits 57 may be arranged in a matrix in row and column directions, and the bit stream signal dpj may be provided in one direction of the row and column directions and the bit stream signal dqk may be provided in the other direction.

When a Galois field GF($2^m$) is used, a circuit correcting n errors determines whether "$\Lambda(x)=0$", through Chien search, by substituting a variable 'x' of an error location search equation ($\Lambda(x)=enx^n+\ldots+e2x^2+e1x+e0$) into respective elements $\alpha^i$ ($i=0, 1, 2, \ldots, 2^{(m-1)}$) of the Galois field GF($2^m$). That is, a value of the error location search equation $\Lambda(x)$ is calculated by substituting respective values of the elements $\alpha^0$, $\alpha^1$, $\alpha^2, \ldots, \alpha^{(t-1)}$ ($t=2$ m).

The Chien search unit 33 according to an embodiment of the inventive concepts provide the values of the respective elements $\alpha^i$ ($i=0, 1, 2, \ldots, 2^{(m-1)}$) to one of the Chien search circuits 57. That is, according to an example embodiment of the inventive concepts, a value of the error location search equation $\Lambda(x)$ when the respective elements $\alpha^i$ ($i=0, 1, 2, \ldots, 2^{(m-1)}$) are substituted may be calculated in batch using the Chien search circuits 57.

In example embodiments of the inventive concept, a plurality of Chien search circuits 57 are arranged in a matrix, a plurality of values substituted into an error location search equation $\Lambda(x)$ are divided into two parts, and values of the two parts are separately provided in two directions perpendicular to a row direction and a column direction. Thus, wirings providing respective substituted values may be formed linearly (i.e., in the shortest distance) by suitably selecting the arrangement of the Chien search circuits 57 and the division of the values.

Example embodiments of the inventive concepts are not limited to the foregoing. For example, the number of information bits or parity bits may vary, each block of the configuration shown as a block diagram may be further divided, or a plurality of blocks may be combined with each other.

Moreover, example embodiments of an error check and correction circuit according are not limited to correction errors in data from a semiconductor memory. For example, an error check and correction circuit according to example embodiments of the inventive concepts may be applied when information is recorded in various recording media.

According to the example embodiments of the inventive concepts, if an n-degree vector representation of a certain element of Galois field GF($2^n$) is regarded as a bit stream of n bits, a first bit stream is calculated by multiplying a desired (or alternatively, a predetermined) value of (n–k) bits by the bit stream and a second bit stream is calculated by multiplying a desired (or alternatively, a predetermined) value of k bits by the bit stream. A Chien search circuit obtains a signal indicating the location of a bit depending on connection of the first bit stream and the second bit stream. Moreover, since the first or second bit stream can be commonly provided to the Chien search circuits arranged in a matrix of rows and columns, a wiring for providing the signal indicating the location of a bit need not be formed at each of the Chien search circuits. Thus, the wirings for providing the signal indicating the location of a bit to the Chien search circuit may decrease. As a result, a circuit size of a Chien search unit can be reduced.

While the example embodiments of the inventive concepts have been particularly shown and described with reference to example embodiments thereof, it will be apparent to those of ordinary skill in the art that various changes in form and detail may be made therein without departing from the spirit and scope of the inventive concepts as defined by the following claims.

What is claimed is:

1. An error check and correction circuit comprising:
   a Chien search unit configured to determine whether there is an error in each data stream using an element of a Galois field GF having $2^n$ elements as a substituted value in an error location search equation, where n is a natural number, the Chien search unit including,
   a calculation circuit configured to,
      calculate a first bit stream by multiplying a value of (n-k) bits by a plurality of elements, where k is a natural number, and
      calculate a second bit stream by multiplying a value of k bits by the plurality of elements; and
   a plurality of Chien search circuits arranged in a matrix in row and column directions having the first bit stream provided in a first one of the row and column direction and the second bit stream provided in a second one of the row and column direction, the plurality of Chien search circuits configured to,
      calculate the element by connecting the first bit stream and the second bit stream, and
      substitute the calculated element into the error correction search equation.

2. The error check and correction circuit as set forth in claim 1, wherein a number of the plurality of Chien search circuits is equal to or larger than a number of bits of the data stream.

3. A semiconductor memory comprising:
   a memory cell;
   a data storage configured to temporarily maintain a data stream read from the memory cell; and
   an error check and search circuit including a Chien search unit configured to determine whether there is an error in each of the data streams using an element of Galois field GF having $2^n$ elements as a substituted value of an error location search equation, where n is a natural number, the Chien search unit including,
   a calculation circuit configured to,
      calculate a first bit stream by multiplying a value of (n-k) bit by a plurality of elements, wherein k is a natural number, and
      calculate a second bit stream by multiplying a value of k bit by the plurality of elements; and
   a plurality of Chien search circuits arranged in a matrix in row and column directions having the first bit stream provided in a first one of the row and column direction and the second bit stream provided in a second one of the row and column direction, the plurality of Chien search circuits configured to,
      calculate the element by connecting the first bit stream and the second bit stream, and
      substitute the calculated element into the error correction search equation.

4. An error correction circuit comprising:
   a plurality of Chien search circuits arranged in a matrix and configured to generate an error location indicating signal indicating locations of errors in a group of bits of a bit stream simultaneously using an error correction search equation having indeterminates selected from elements of a finite field.

5. The error correction circuit of claim 4, further comprising:
   an S calculator configured to,
      separate bits in each of the elements of the finite field into a first group of bits and a second group of bits; and
      provide the first group of bits to row lines of the matrix of Chien circuits and the second group of bits to column lines of the matrix of Chien circuits.

6. The error correction circuit of claim 5, wherein the first group of bits is a first one of the least significant bits (LSB) and most significant bits (MSB) of the elements and the second group of bits is a second one of the LSB and MSB of the elements.

7. The error correction circuit of claim 4, further comprising:
   a syndrome calculation circuit configured to generate the error correction search equation such that the error correction search equation is a minimum polynomial representing the group of bits; and
   a coefficient calculator configured to calculate coefficients associated with each of the indeterminates of the error correction search equation.

8. The error correction circuit of claim 7, wherein the Chien circuits are configured to locate errors in the bit stream in the group of bits by,
   substituting the elements from the finite field into the indeterminates of the error correction search algorithm, the elements provided in batch to the matrix of Chien circuits via the first group of bits and the second group of bits,
   calculating a value of the error correction search algorithm based on the substituted elements and the calculated coefficients, and
   determining if the group of bits contains errors based on a result of the calculation.

9. The error correction circuit of claim 8, wherein the plurality of Chien search are configured to determine a bit within the group of bits contains errors when the calculated value of the error correction search algorithm does not equal zero.

10. The error correction circuit of claim 4, wherein the error correction circuit is configured to correct the error by inverting a bit value at locations within the group of bits determined to contain the errors.

* * * * *